United States Patent
Srivastava (10) Patent No.: US 11,042,684 B1
(45) Date of Patent: Jun. 22, 2021

(54) DYNAMIC WIDTH-SPACE PATTERNS FOR HANDLING COMPLEX DRC RULES

(71) Applicant: Cadence Design Systems, Inc., San Jose, CA (US)

(72) Inventor: Sachin Srivastava, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/694,806

(22) Filed: Nov. 25, 2019

(51) Int. Cl.
*G06F 30/398* (2020.01)
*G06F 30/31* (2020.01)

(52) U.S. Cl.
CPC ............ *G06F 30/398* (2020.01); *G06F 30/31* (2020.01)

(58) Field of Classification Search
CPC ........ G06F 30/398; G06F 30/31; G06F 30/39; G06F 30/392; G06F 30/394
See application file for complete search history.

(56) References Cited

U.S. PATENT DOCUMENTS

| | | | |
|---|---|---|---|
| 8,984,465 B1 | 3/2015 | Salowe | |
| 9,003,349 B1 * | 4/2015 | Salowe | G06F 30/398 716/129 |
| 9,104,830 B1 | 8/2015 | Salowe et al. | |
| 9,117,052 B1 | 8/2015 | Salowe et al. | |
| 9,251,299 B1 | 2/2016 | Salowe | |
| 9,372,955 B1 | 6/2016 | Lee et al. | |
| 9,396,301 B1 | 7/2016 | Lee et al. | |
| 9,563,737 B1 | 2/2017 | Arkhipov et al. | |
| 9,659,138 B1 | 5/2017 | Powell et al. | |
| 9,817,941 B2 * | 11/2017 | Salowe | G06F 30/394 |
| 9,904,756 B1 * | 2/2018 | Ruehl | G06F 30/398 |
| 10,049,175 B1 | 8/2018 | Salowe et al. | |
| 10,296,695 B1 | 5/2019 | Lee et al. | |
| 10,452,806 B1 | 10/2019 | Rossman et al. | |
| 10,810,348 B1 * | 10/2020 | Darden | G03F 7/70466 |
| 2018/0285508 A1 * | 10/2018 | Pandey | G06F 30/394 |
| 2019/0122984 A1 * | 4/2019 | Kim | H01L 23/5226 |

* cited by examiner

*Primary Examiner* — Helen Rossoshek
(74) *Attorney, Agent, or Firm* — Foley & Lardner LLP (57) ABSTRACT

Embodiments according to the present disclosure relate to physically implementing an integrated circuit design using track patterns while conforming to the requirements of complex color based track systems, and using information about instances that have been included in the design. According to some aspects, the present embodiments provide "Dynamic Width Space Patterns (DWSP)" which are WSPs that are modified dynamically in consideration of neighboring geometries such that shapes created or edited using WSPs are design rule compliant. Embodiments can include providing visual indicators in a display of a portion of a design that is being created or edited, as well as possibly other alerts, so as assist a designer in creating a design rule compliant integrated circuit design that is also subject to WSPs.

20 Claims, 7 Drawing Sheets

DYNAMIC WIDTH-SPACE PATTERNS FOR HANDLING COMPLEX DRC RULES

TECHNICAL FIELD

The present disclosure relates to integrated circuits, and more particularly to techniques for implementing designs of integrated circuits in processes that include track based systems.

BACKGROUND

Electronic design automation (EDA) tools are used to design electronic circuits such as integrated circuits. Integrated circuits can include many thousands and perhaps millions of circuit elements (e.g., transistors, logic gates, diodes, etc.) and interconnecting wires and busses. The circuit elements and wires can be formed on many different layers, with various interconnections (e.g., vias) between layers. Some EDA tools allow a designer to describe an integrated circuit based on its desired behavior, and then transform that behavioral description into a set of geometric shapes called a layout which forms the circuit elements and wires for all the different layers.

Some EDA tools further allow certain components to be specified at a high level of abstraction and then replicated many times in the overall integrated circuit, each being called an "instance," at lower levels of abstraction and placed on different layers of the integrated circuit. Any given instance can include dozens or more geometric shapes, and some shapes in the same instance can be placed in different layers, for example to allow for shapes to be aligned with different tracks or other specified directions associated with different layers. Instances can also include "pins," which are elements that allow the instance to be connected with other components via wires and busses for example.

As integrated circuit feature sizes continually get smaller and smaller (e.g., 10 nm and below), EDA tools need to be aware of an ever-increasing number of constraints (i.e., design rules or design rule manuals (DRMs)) to ensure that shapes are placed correctly for a target fabrication process. For example, some foundries specify that shapes of a design can only be placed in parallel routing tracks (hereinafter "tracks") running in one direction of a given layer or portion of a layer and shapes in these tracks must conform to certain legal width requirements (e.g., having a specific one of a number of pre-specified legal widths). Moreover, to allow a design to be implemented by multiple patterning processes (e.g., double patterning, self-aligned double patterning (SADP), etc.), shapes in adjacent tracks of a given layer of an integrated circuit may have alternate colors (e.g., B for shapes to be included in a "blue" photomask, C for shapes to be included in a "cyan" photomask, etc.) and the widths for shapes in adjacent tracks may need to conform to further requirements.

Patterns of tracks can be specified for an integrated circuit design, wherein a set of adjacent tracks have associated widths, spacing and colors (e.g., width spacing patterns (WSPs)), and these patterns can be repeated in a given layer with a corresponding period. Tracks themselves have zero width and no components in physical designs (e.g., a layout of an electronic design) and are merely used to guide EDA physical implementation tools (e.g., floorplanner, placement tools, or routing tools) to implement the physical design for an electronic circuit. For example, a routing tool may lay the centerline of a wire segment along a routing track during the routing process. The width associated with a particular routing track is used to route wires having shapes with the associated width.

Even when a track pattern has been specified for a particular design, the shapes created using those patterns may further need to comply with many different design rules, which the fixed track pattern itself cannot guarantee in conventional approaches.

SUMMARY

Embodiments according to the present disclosure relate to physically implementing an integrated circuit design using track patterns while conforming to the requirements of complex color based track systems, and using information about instances that have been included in the design. According to some aspects, the present embodiments provide "Dynamic Width Space Patterns (DWSP)" which are modified dynamically in consideration of neighboring geometries such that shapes created or edited using WSPs are design rule compliant. Embodiments can include providing visual indicators in a display of a portion of a design that is being created or edited, as well as possibly other alerts, so as assist a designer in creating a design rule compliant integrated circuit design that is also subject to WSPs.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain general aspects, the present embodiments relate to physically implementing integrated circuit designs such that they conform to complex constraints imposed by fabrication processes. According to certain additional aspects, the present embodiments relate to providing EDA tools that are aware of these constraints and are adapted to implement designs that conform with them.

For example, some fabrication processes require all circuit elements to be located in tracks having specified widths and that are separated by specified gaps. These tracks are generally specified to run in a single direction on a given layer or designated portion or region of a layer of the integrated circuit. For example, the tracks on one layer may be specified to run in a vertical or north-south direction, while the tracks on an adjacent layer above or below may be specified to run in a horizontal or east-west direction. In some fabrication processes, the tracks are specified to have uniform widths and uniform spacing. However, at process nodes of 10 nm and below, integrated circuit designs may need to conform to complex track systems called width spacing patterns ("WSPs").

Another constraint of which EDA tools need to be aware are those imposed by multiple patterning processes, of which double patterning (DP) is a common example. These processes separate a layout into two or more patterns, which are then separately imaged onto the same layer of the integrated circuit using separate masks. The process of separating a layout into two or more patterns is called "coloring." In the coloring process, each shape in the design is assigned to one of the multiple patterns or is figuratively "colored" with a color respectively associated with the assigned pattern. In other words, all shapes assigned to the same pattern in a given layer share the same color.

Some integrated circuit processes include both track and coloring constraints. In such cases, not only are shapes assigned to specified patterns or associated colors, tracks are also assigned to specified patterns or associated colors. Typically, for a double patterning process, adjacent tracks are assigned to alternating colors, with similar types of assignment schemes for higher order patterning processes. Design rules for a process that governs which tracks associated with certain widths may be situated immediately adjacent to another track associated with a width are referred to as pair rules or BC rules where B stands for blue and C stands for cyan in a double patterning processes. Design rules governing which three-width combinations are legal are referred to as triplet rules or BCB rules.

In addition to design rules, requirements, or constraints (hereinafter design rules or rules collectively) that govern tracks and WSPs, other complex design rules may govern the implementation of electronic designs. Illustrative design rules may include, for example, a minimum length rule governing the minimum length required for an interconnect segment, a span length spacing design rule, allowed width ranges, a different track line-end design rule, a keep-out design rule, or one or more design rules governing repetitive track patterns, etc. Among other things, the present Applicant recognizes that although conventional WSPs can ease the design of integrated circuits by assisting with compliance with width-spacing rules, the burden of complying with other complex design rules is often left to separate tools that are run after the design stage, such as a design rule checker.

Figure 1:
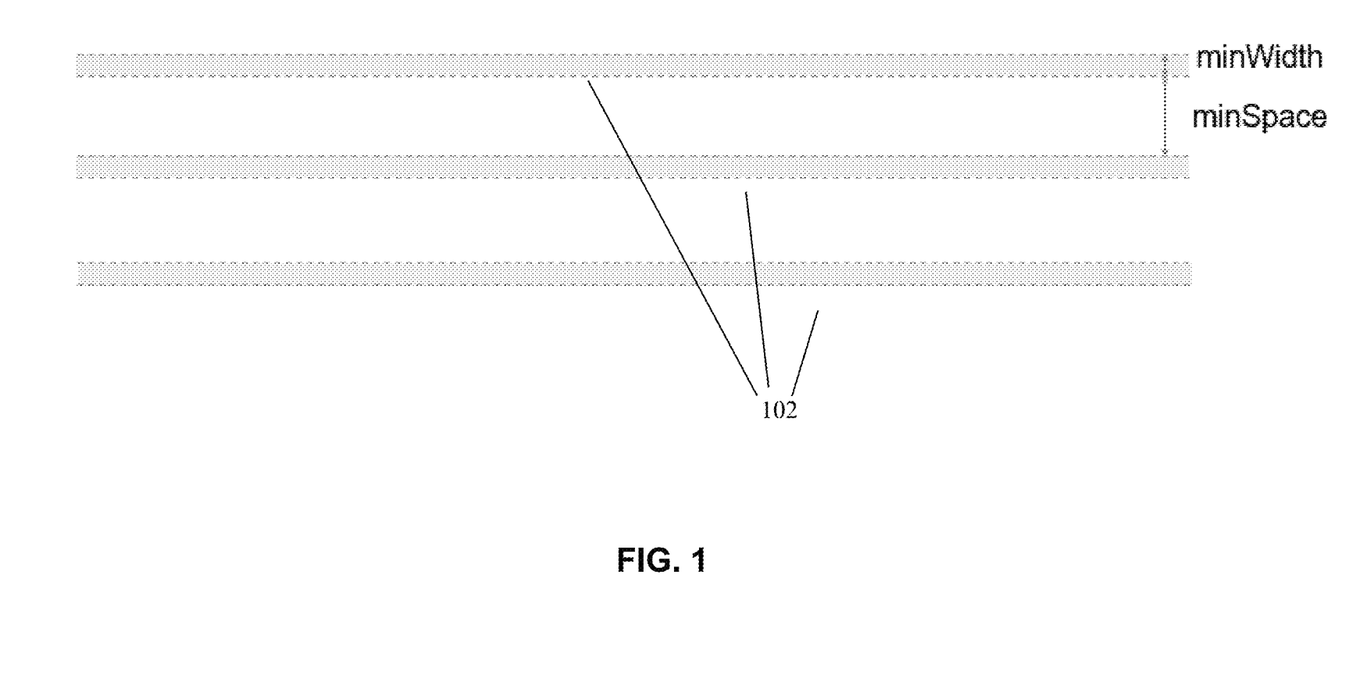
FIG. 1 is a diagram illustrating example aspects of WSPs (i.e. track patterns) in an integrated circuit design.

FIG. 1 illustrates certain aspects of the present embodiments.

As shown in FIG. 1, in designs for advanced nodes (e.g., 10 nm and below), shapes (e.g. associated with wires, etc.) are typically placed in a uniform, row based format. For example, in a common integrated circuit design, shapes are placed on or in tracks 102 for a given layer of the design. As further shown in FIG. 1, Width-Space Patterns (WSP) define tracks 102 as width and spacing pairs. In other words, WSPs specify a minimum spacing between tracks in the design, as well as the minimum width of any shape in any given track.

WSPs thus help users in creating shapes which are width and spacing rule compliant. For example, when a user is creating or editing shapes in a design for an integrated circuit using an EDA tool (e.g. a place and route tool), the EDA tool (with awareness of the WSP for the design) can visually display tracks 102 or otherwise cause shapes to be "snapped" or aligned along the center lines of tracks 102 that comply with the WSPs for the design. Moreover, when shapes are edited or created, they can be forced to have at least a width specified by the minimum width for the WSP.

Although such tools having WSP awareness are useful, the present Applicant has recognized that conventional tools that enforce WSPs (i.e. track patterns) have several shortcomings. For example, conventional WSP enforcement only addresses width and spacing rules, and do not consider other rules that may be applicable to a given design or process (e.g. design rules). More particularly, while conventional tools can handle single value width and spacing rules, the required spacing between tracks and/or between shapes in the same or other tracks may further depend on design rules or other rules for a particular process or design.

Table 1 below shows an example aspects of how WSP's can be subject to additional rules such as parallel run length (PRL) rules.

TABLE 1

| width | prl1 | prl2 | prl3 |
| --- | --- | --- | --- |
| w1 | S11 | S12 | S13 |
| w2 | S21 | S22 | S23 |
| w3 | S31 | S32 | S33 |

As can be seen in Table 1, for a given width (w1, w2 or w3 in this example) in a WSP, there are three possible corresponding spacings, depending on the parallel run length rule (three rules prl1, prl2, prl3) that is associated with the process or design. For example, if the width in the WSP is w1, then the corresponding spacing will be S11, S12 or S13, depending on whether the parallel run length rule is prl1, prl2 or prl3, respectively.

Likewise, if the width and spacing rules associated with a particular process or design are fixed, then a particular parallel run length rule may also be fixed. For example, if the WSP for a given process or design is specified to be a width of w2 and a spacing of S22, then the parallel run length rule prl2 must also be enforced for that process or design. There can be similar WSP limitations for other complex DRC rules, such as end-to-end spacing, endOfLineKeepout, etc.

According to certain aspects, therefore, the present embodiments provide Dynamic Width Space Patterns (DWSPs or dynamic WSPs). For example, while conventional WSPs are fixed, DWSPs can change with various edits in the design. When the user starts an edit, the display changes in accordance with the edit being performed and to provide visual indications to the user regarding design rule limitations on further edits. When editing of the shape finalized, the DWSPs are adjusted with information about the new shape and possible design rule limitations on future edits.

Figure 2A:
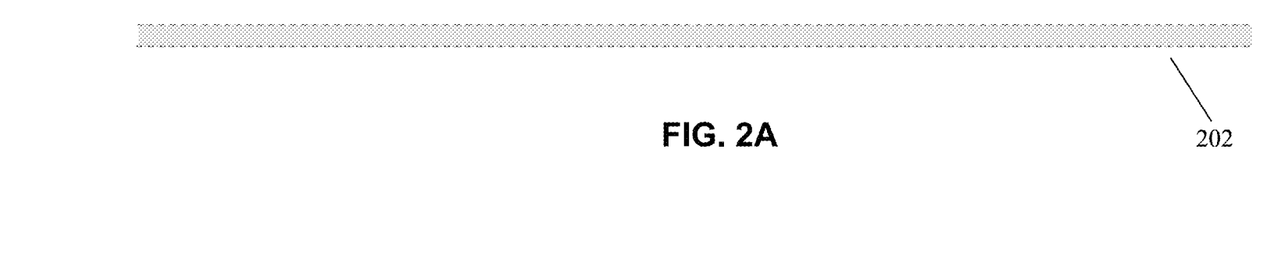
FIGS. 2A to 2C are diagrams illustrating aspects of dynamic WSPs for handling a maximum length design rule according to embodiments.
Figure 2B:
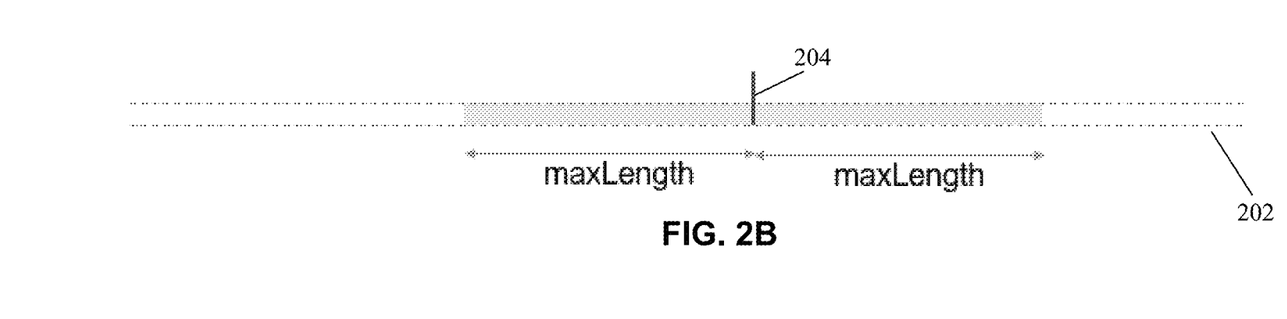
Figure 2C:
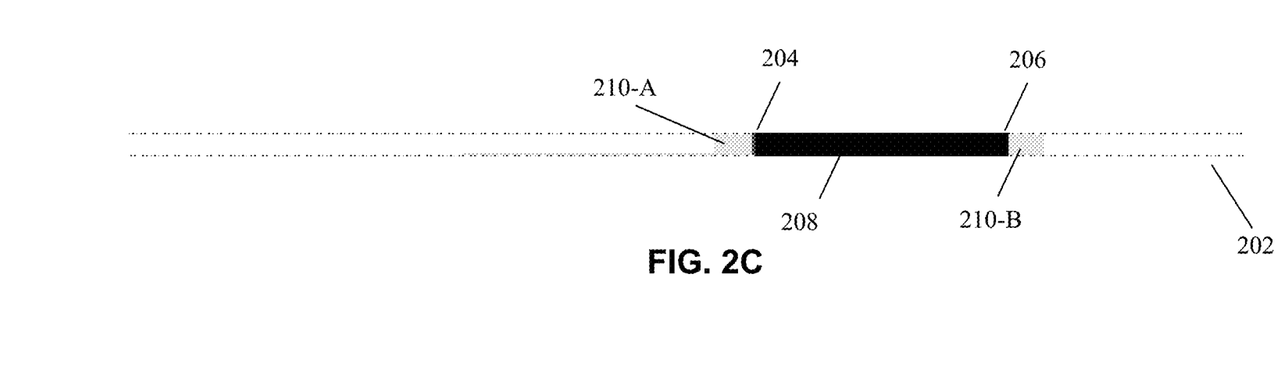

FIGS. 2A to 2C illustrate an example of how dynamic WSPs according to embodiments allow for enforcement of a maximum length design rule.

FIG. 2A shows a track 202, for example as shown in a display of an EDA tool (e.g. part of a graphical user interface) before any shapes have been placed on the track 202. As shown, track 202 has a width W that can correspond to the minimum width specified by the initial WSP. For example, the EDA tool can identify the center lines of all tracks in the WSP for the given layer or portion of a layer, and determine the minimum width of a shape that is placed on the center line of the track. The EDA tool can further use this information to generate a display of all tracks for a portion of a layer in the integrated circuit design that a user has selected to view, including track 202 in this example.

FIG. 2A further shows how track 202 can be shaded with a uniform shade or color by the EDA tool throughout the length of the track 202 for the portion of the integrated circuit design that has been selected for view by the user. This shading can provide visual information to the user that indicates that a shape can legally (i.e. compliant with all design rules) be inserted onto the track 202 in any location of the track having that shade. This is in addition to the visual information showing how any shape must have a width that is at least as wide as the dimension W, which corresponds to the minimum width of the WSP.

FIG. 2B illustrates an example of what can happen when a user clicks at a point 204 in track 202 according to embodiments. For purposes of this example, the user clicks at point 204 in connection with an operation to edit the integrated circuit design by creating a new wire. This integrated circuit design operation can be selected using a menu in an EDA tool that has been adapted with the functionality of the present embodiments (e.g. a layout editor tool), for example.

As further shown in FIG. 2B, when a user clicks at a point 204 in track 202 to create a new wire, the display of the track is changed by an EDA tool that has been adapted for use in the present embodiments. More particularly, in this example, the EDA tool changes the display based on a maximum length DRC rule by causing the color or shade of track 202 to be altered beyond a length from point 204 that corresponds to the maximum length in the DRC rule. In this example, the display of track 202 that is within the maximum length from either to the left or right of point 204 is kept the same, whereas the display of track 202 that is beyond the maximum length from both the left and right of point 204 is altered to another color or shade, in this case to white. This provides visual information to the user that indicates that the new wire to be created can legally only extend a certain amount from point 204. More particularly, starting from point 204 and going only to the left direction in track 202, a wire can only be created to have a length indicated by the color or shaded region extending a length of the maximum length rule to the left of point 204. Likewise, starting from point 204 and going only to the right direction in track 202, a wire can only be created to have a length indicated by the color or shaded region extending a length of the maximum length rule to the right of point 204.

As shown in FIG. 2C, the EDA tool can cause the display of track 202 to be further altered or updated as a user proceeds to create or edit the new wire, for example by clicking and dragging from point 204 to point 206 in track 202. More particularly, in this example, in response to the clicking and dragging to the right starting from point 204, a visual indicator 208 of a wire is displayed in track 202, in this example having a width that is the same as the minimum width of the WSP (although larger widths are possible). Moreover, the size of the shaded regions to the left and the right of wire 208 are reduced to indicate the remaining lengths that the wire 208 can still be extended in either direction while adhering to the maximum length rule. In these and other embodiments, if the user causes the wire 208 to have a length that is equal to the maximum length (in which case the color of the track to the right and left of wire 208 will be completely white in this example), the EDA tool can prevent the user from causing the wire 208 to extend any further length in either the right or left directions in track 202. This act of preventing can further include the EDA tool generating a visual or audible alert or message informing the user of the inability to extend the wire 208 due to the maximum length rule.

In accordance with the "dynamic" WSPs aspects of the present embodiments, until the user actually completes editing or creating a shape such as wire 208, no actual changes are made to the WSPs of the design. Rather, only the visual displays are changed such as the changes to the colors of track 202 as described above. However, after completing the creating or editing of a shape, such as wire 208 in track 202 in FIG. 2C, the EDA tool according to embodiments can cause the WSPs for the design to be dynamically updated. For example, if a user completes wire 208 as shown in FIG. 2C, the EDA tool can cause the WSPs for the design to be updated with information regarding the location of wire 208 in the specific track 202 of the WSPs, as well as sizes and locations of the remaining portions 210-A and 210-B adjacent to wire 208 to which the wire 208 can possibly be extended in future edits.

Figure 3A:
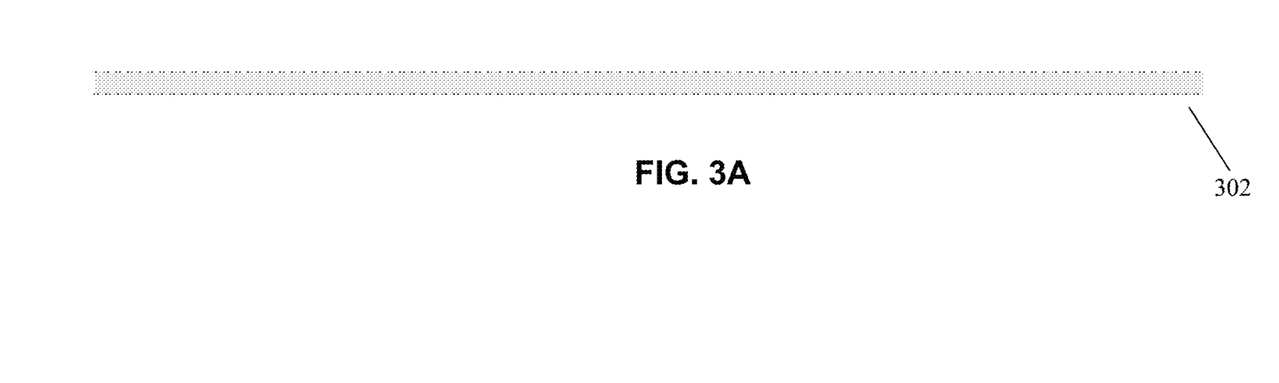
FIGS. 3A and 3B are diagrams illustrating aspects of dynamic WSPs for handling an end-to-end line spacing design rule according to embodiments.
Figure 3B:
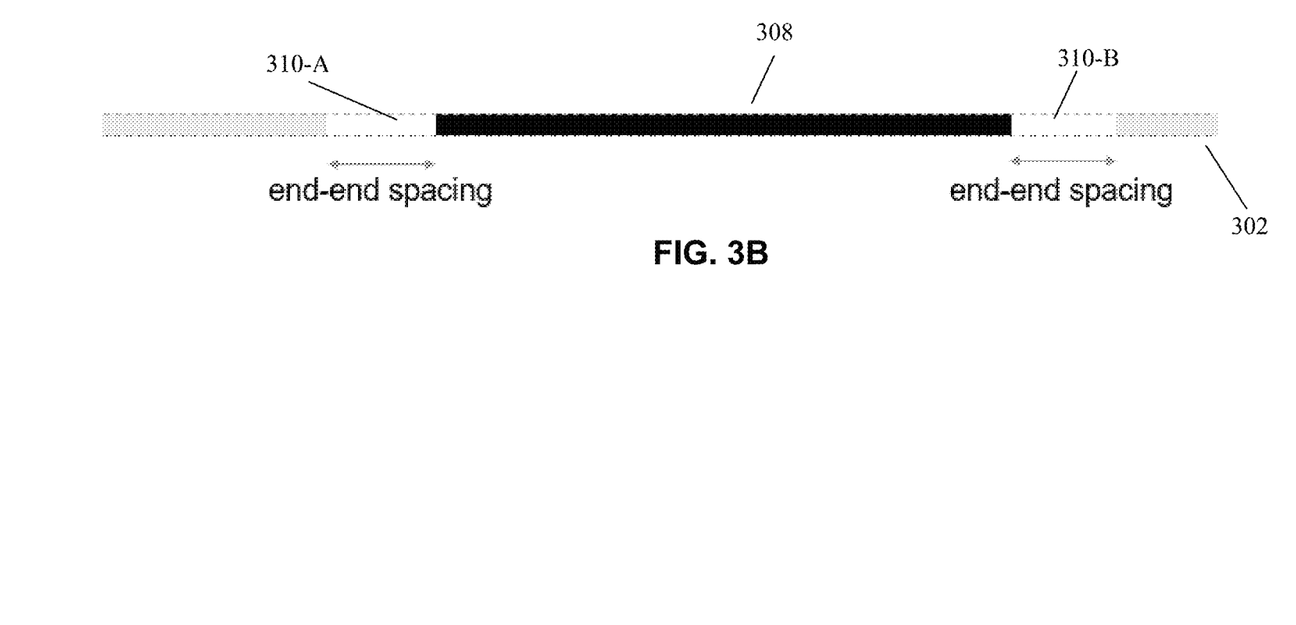

FIGS. 3A and 3B illustrate an example of how dynamic WSPs according to embodiments allow for enforcement of a line end-to-end spacing rule.

FIG. 3A shows a track 302, for example as shown in a display of an EDA tool (e.g. part of a graphical user interface) before any shapes have been placed on the track 302. Similar as described above in connection with FIG. 2A, shown, track 302 has a width that can correspond to the minimum width specified by the initial WSP. Moreover, track 302 can be shaded with a uniform shade or color by the EDA tool throughout the length of the track 302 for the portion of the integrated circuit design that has been selected for view by the user. This shading can provide visual information to the user that indicates that a shape can legally (i.e. compliant with all design rules) be inserted onto the track 302 in any location of the track having that shade.

FIG. 3B illustrates an example of what can happen after a user creates a wire 308 in track 302 according to embodiments, for example by selecting to create a wire using a menu in an EDA tool that has been adapted with the functionality of the present embodiments (e.g. a layout editor tool), and by clicking and dragging a cursor as described above in connection with FIG. 2C. As shown in FIG. 3B, after a user creates wire 308 in track 302, the display of the track is changed by an EDA tool that has been adapted for use in the present embodiments. More particularly, in this example, the EDA tool changes the display based on a line end-to-end spacing DRC rule by causing the color or shade of track 302 to be altered beyond either end of wire 308 for a length that corresponds to the line end-to-end spacing in the DRC rule. In this example, the display of track 302 that is within the line end-to-end spacing from either to the left or right of wire 308 is altered to another color or shade, in this case to white. This provides visual information to the user that indicates that any new wire to be created can legally only start outside the altered regions of track 302. More particularly, starting from the left of wire 308, a new wire can only be created in track 302 outside of region 310-A. Likewise, starting from the right of wire 308, a new wire can only be created in track 302 outside of region 310-B. In these and other embodiments, after the user completes the creating of wire 308, the EDA tool can thereafter prevent the user from creating a new wire starting in either of regions 310-A or 310-B. This act of preventing can further include the EDA tool generating a visual or audible alert or message informing the user of the inability to begin creating a new wire in either of these regions.

As described above, and in accordance with the "dynamic" WSPs aspects of the present embodiments, until the user actually completes editing or creating a shape such as wire 308, no actual changes are made to the WSPs of the design. Rather, only the visual displays are changed such as the changes to the colors of track 302 as described above. However, after completing the creating or editing of a shape, such as wire 308 in track 302 in FIG. 3B, the EDA tool according to embodiments can cause the WSPs for the design to be dynamically updated. For example, if a user completes wire 308 as shown in FIG. 3B, the EDA tool can cause the WSPs for the design to be updated with information regarding the location of wire 308 in the specific track 302 of the WSPs, as well as sizes and locations of the regions 310-A and 310-B adjacent to wire 308 inside of which new wires can be created in future edits, so as not to violate a line end-to-end spacing rule.

Figure 4A:
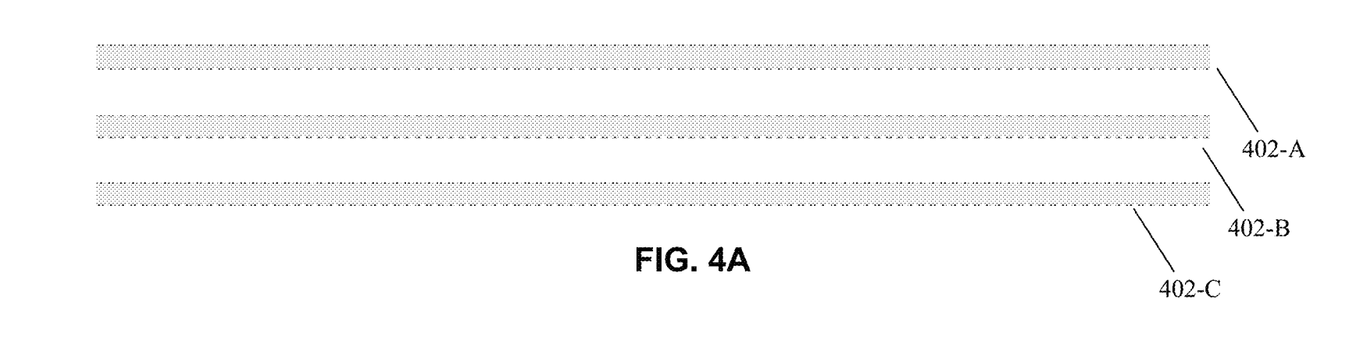
FIGS. 4A and 4B are diagrams illustrating aspects of dynamic WSPs for handling an end-of-line keepout design rule according to embodiments.
Figure 4B:
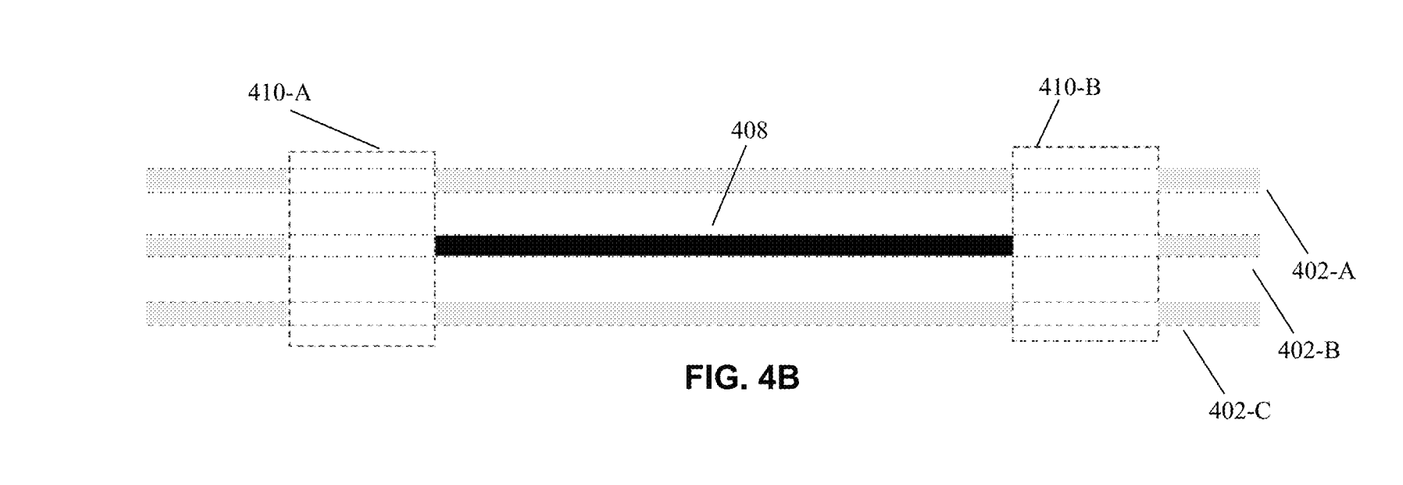

FIGS. 4A and 4B illustrate an example of how dynamic WSPs according to embodiments allow for enforcement of an end-of-line keepout rule.

FIG. 4A shows an initial set of tracks 402-A, 402-B and 402-C, for example as shown in a display of an EDA tool (e.g. part of a graphical user interface) before any shapes have been placed on the tracks 402-A, 402-B, and 402-C. Similar as described above in connection with FIGS. 2A and 2B, as shown, tracks 402-A, 402-B and 402-C have a width that can correspond to the minimum width specified by the initial WSP. Moreover, tracks 402-A, 402-B and 402-C can be shaded with a uniform shade or color by the EDA tool throughout the length of the tracks 402-A, 402-B and 402-C for the portion of the integrated circuit design that has been selected for view by the user. This shading can provide visual information to the user that indicates that a shape can legally (i.e. compliant with all design rules) be inserted onto the track 302 in any location of the track having that shade.

FIG. 4B illustrates an example of what can happen after a user creates a wire 408 in track 402-B according to embodiments, for example by selecting to create a wire using a menu in an EDA tool that has been adapted with the functionality of the present embodiments (e.g. a layout editor tool), and by clicking and dragging a cursor as described above in connection with FIG. 2C. As shown in FIG. 4B, after a user creates wire 408 in track 402-B, the display of the tracks is changed by an EDA tool that has been adapted for use in the present embodiments. More particularly, in this example, the EDA tool changes the display based on an end-of-line keepout DRC rule by causing the color or shade of track 402-B, as well as adjacent tracks 402-A and 402-C to be altered beyond either end of wire 408 for a length that corresponds to the end-of-line keepout length specified in the DRC rule. In this example, the displays of tracks 402-A, 402-B and 402-C that are within the end-of-line keepout space from either to the left or right of wire 408 are altered to another color or shade, in this case to white. Moreover, a dotted line is further displayed around these spaces to thereby define and highlight keepout regions 410-A and 410-B. This provides visual information to the user that indicates that any new wire or shape to be created can legally only start outside the altered regions of tracks 402-A, 402-B and 402-C. More particularly, starting from the left of wire 408, a new wire or shape can only be created in tracks 402-A, 402-B and 402-C outside of region 410-A. Likewise, starting from the right of wire 408, a new wire can only be created in tracks 402-A, 402-B and 402-C outside of region 410-B. In these and other embodiments, after the user completes the creating of wire 308, the EDA tool can thereafter prevent the user from creating a new wire starting in either of regions 310-A or 310-B. This act of preventing can further include the EDA tool generating a visual or audible alert or message informing the user of the inability to begin creating a new wire in either of these regions.

As described above, and in accordance with the "dynamic" WSPs aspects of the present embodiments, until the user actually completes editing or creating a shape such as wire 408, no actual changes are made to the WSPs of the design. Rather, only the visual displays are changed such as the changes to the colors of tracks 402-A, 402-B and 402-C and regions 410-A and 410-B as described above. However, after completing the creating or editing of a shape, such as wire 408 in track 402-B in FIG. 4B, the EDA tool according to embodiments can cause the WSPs for the design to be dynamically updated. For example, if a user completes wire 408 as shown in FIG. 4B, the EDA tool can cause the WSPs for the design to be updated with information regarding the location of wire 408 in the specific track 402-B of the WSPs, as well as sizes and locations of the regions 410-A and 410-B adjacent to wire 408 inside of which new wires or shapes can be created in future edits, so as not to violate a line end-to-end spacing rule.

Figure 5A:
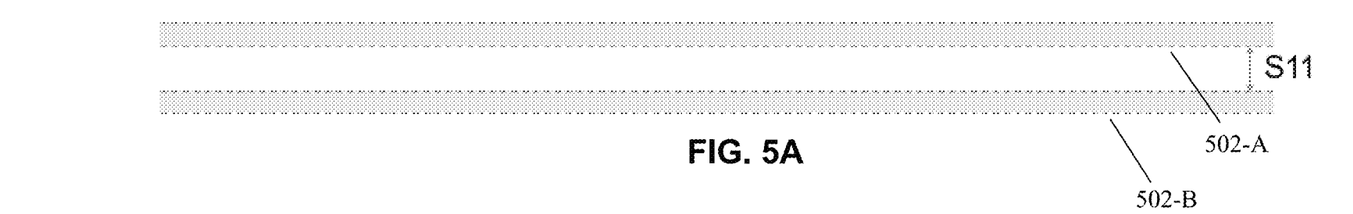
FIGS. 5A to 5C are diagrams illustrating aspects of dynamic WSPs for handling a parallel run length design rule according to embodiments.
Figure 5B:
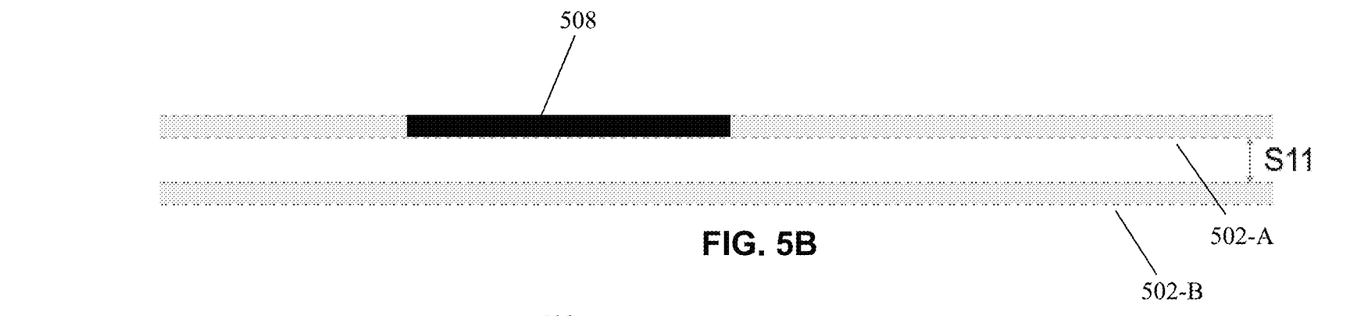
Figure 5C:
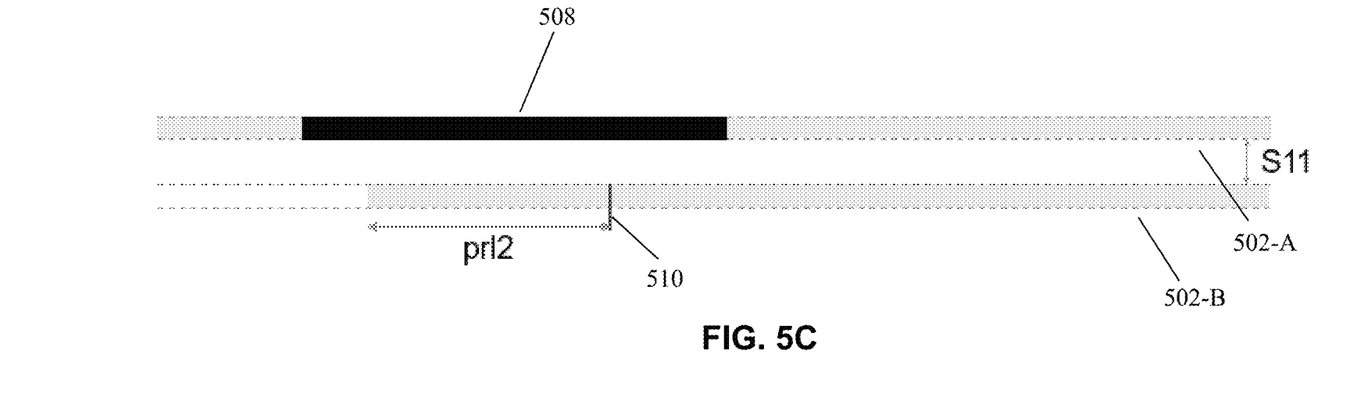

FIGS. 5A to 5C illustrate an example of how dynamic WSPs according to embodiments allow for enforcement of a parallel run length design rule.

FIG. 5A shows adjacent tracks 502-A and 502-B, for example as shown in a display of an EDA tool (e.g. part of a graphical user interface) before any shapes have been placed on the tracks 502-A and 502-B. As with the previous examples, tracks 502-A and 502-B can have a width that can correspond to the minimum width specified by the initial WSP. As further shown in FIG. 5A, the adjacent tracks have a spacing S11 that is also specified by the initial WSP. As in the previous examples, FIG. 5A further shows how tracks 502-A and 502-B can be shaded with a uniform shade or color by the EDA tool throughout the length of the tracks 502-A and 502-B for the portion of the integrated circuit design that has been selected for view by the user. This shading can provide visual information to the user that indicates that a shape can legally (i.e. compliant with all design rules) be inserted onto the tracks 502-A and 502-B in any location of the track having that shade.

FIG. 5B illustrates an example of what can happen when a user creates a wire 508 in track 502-A according to embodiments. For purposes of this example, the user clicks at a point in track 502-A in connection with an operation to edit the integrated circuit design by creating a new wire. As in the previous examples, this integrated circuit design operation can be selected using a menu in an EDA tool that has been adapted with the functionality of the present embodiments (e.g. a layout editor tool), for example. As further shown in FIG. 5B, the EDA tool can cause the display of track 502-A to be further altered or updated as a user proceeds to create or edit the new wire 508, for example by clicking and dragging from an initial point in track 502-B to another point in track 502-A. More particularly, in this example, in response to the clicking and dragging in track 502-A, a visual indicator 508 of a wire is displayed in track 502-A, in this example having a width that is the same as the minimum width of the WSP (although larger widths are possible).

As shown in FIG. 5C, and in accordance with the "dynamic" WSPs aspects of the present embodiments, until the user actually completes editing or creating a shape such as wire 508, no actual changes are made to the WSPs of the design. Rather, only the visual displays are changed such as the changes to the colors of track 502-A as described above. However, after completing the creating or editing of a shape, such as wire 508 in track 502-A in FIG. 5C, the EDA tool according to embodiments can cause the WSPs for the design to be dynamically updated. For example, if a user completes wire 508 as shown in FIG. 5C, the EDA tool can cause the WSPs for the design to be updated with information regarding the location of wire 508 in the specific track 502-A of the WSPs for use in future edits.

For example, the EDA tool can have information about parallel run length design rules similar to that shown in TABLE 1 above. As shown in that example, when the WSP specifies a spacing of S11 as is the case in the examples of FIGS. 5A to 5C, the corresponding maximum parallel run length is prl1. Accordingly, as shown in FIG. 5C, when the user starts creating a new wire in track 502-B adjacent to existing wire 508 in track 502-A (e.g. by clicking in track 502-B at point 510), the display of track 502-B can be changed in accordance with the parallel run length rule. More particularly, after clicking at point 510, the display of track 502-B is altered or updated to cause the color or shade to the left of point 510 to be changed, in this example to white. This provides visual information to the user that indicates that any new wire or shape to be created can legally only extend a distance of prl1 to the left of point 510. However, starting from the right of point 510, there is no change to the display of track 502-B because a parallel run length between 508 and any new wire in 502-B will never exceed the distance prl1 (irrespective of the length of the new wire on the right hand side of 510). In these and other embodiments, the EDA tool can further prevent the user from creating a new wire or shape in track 502-B to the left of point 510 that exceeds the parallel run length limit. This act of preventing can further include the EDA tool generating a visual or audible alert or message informing the user of the inability to create such a new wire or shape.

It should be noted that embodiments can include dynamic WSPs for some or all of the above example design rules in various combinations, or separately. Moreover, while the above describes how embodiments are performed for only certain specific complex design rules, those skilled in the art will understand how to extend the principles of the above embodiments to handling other design rules, and the embodiments are not limited to only the illustrated example design rules.

Figure 6:
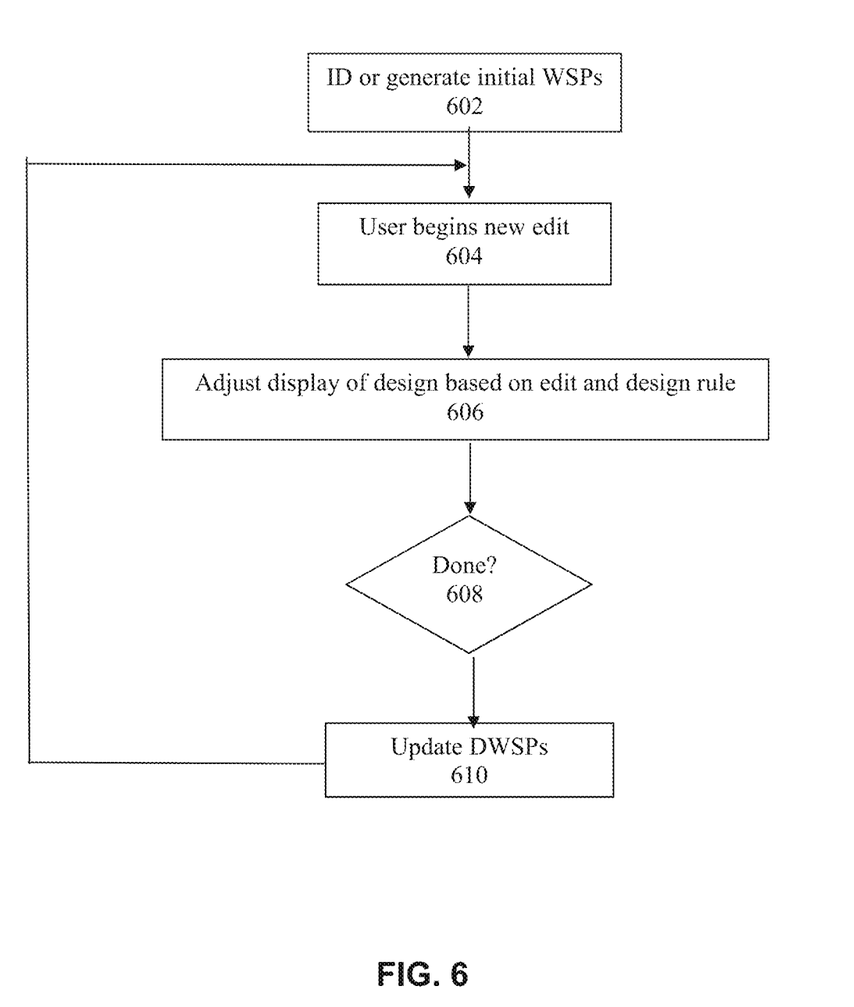
FIG. 6 is a flowchart illustrating another example methodology for dynamic WSPs for handling complex design rules in an integrated circuit design according to the present embodiments.

FIG. 6 is a flowchart illustrating an example methodology according to embodiments.

As shown, example method 600 includes block 602, where an EDA tool can generate or identify an initial set of WSPs for a design that is being accessed for creating or editing. The WSPs can be generated using any one of a variety of known or proprietary techniques, such as some or all of the techniques for generating track patterns described in U.S. Pat. No. 10,452,806, the contents of which are incorporated herein by reference in their entirety. The WSPs may or may not include WSPs for multiple patterning processes, such as SADP.

Block 604 of example method 600 can be initiated whenever user begins an edit of a design. For example, an EDA tool can generate a display of a portion of a design (e.g. via a graphical user interface), including a display of tracks before any shapes have been placed on them. Using the WSP information, the EDA tool can generate a display of all tracks for a portion of a layer in the integrated circuit design that a user has selected to view, including track 202 in this example. As further described above, the track(s) can be shaded with a uniform shade or color by the EDA tool throughout the length of the track for the portion of the integrated circuit design that has been selected for view by the user. This shading can provide visual information to the user that indicates that a shape can legally (i.e. compliant with all design rules) be inserted onto the track in any location of the track having that shade.

Block 604 can further include determining when a user is starting a new edit of a design. As set forth in the above examples, this can include when a user clicks at point in one of the displayed tracks in connection with an operation to edit the integrated circuit design by creating a new wire or shape, or placing an instance of a cell. This integrated circuit design operation can be selected using a menu in an EDA tool that has been adapted with the functionality of the present embodiments (e.g. a layout editor tool), for example.

In block 606 of example method 600, the visual display of the WSPs can be adjusted in connection with the edit being performed, and in view of one or more design rules. For example, when a user clicks at a point in track to create a new wire, the display of the track can be changed by the EDA tool, such as changing a color of portions of one or more tracks based on a design rule (e.g. changing the display of a track in which a wire is being created in accordance with a maximum length design rule). The visual changes can be dynamically adjusted or updated, for example as a user proceeds to create or edit a new wire, for example by clicking and dragging from point to point in a track 202. Block 606 can further include the EDA tool preventing the user from causing the wire or shape to be extended or adjusted in violation of a design rule. This act of preventing can further include the EDA tool generating a visual or audible alert or message informing the user of the potential violation of the rule.

Block 608 can include a determination of whether the edit has been completed (e.g. the user clicks a "save" button, stops editing the track and moves to another portion of the design, or various other actions).

In accordance with the "dynamic" WSPs aspects of the present embodiments, in response to a determination in block 608 that the user has completed editing or creating a shape such as a wire, in block 610 the EDA tool according to embodiments can cause the WSPs for the design to be dynamically updated. For example, if a user completes creating a wire in a track, the EDA tool can cause the WSPs for the design to be updated with information regarding the location of wire in the specific track of the WSPs, as well as other information related to one or more design rules (e.g. sizes and locations of the remaining portions of a track to which the wire can possibly be extended in future edits in accordance with a maximum length design rule).

As shown, after block 610 has been completed, control can be returned to block 604 for any new edits to the design.

Figure 7:
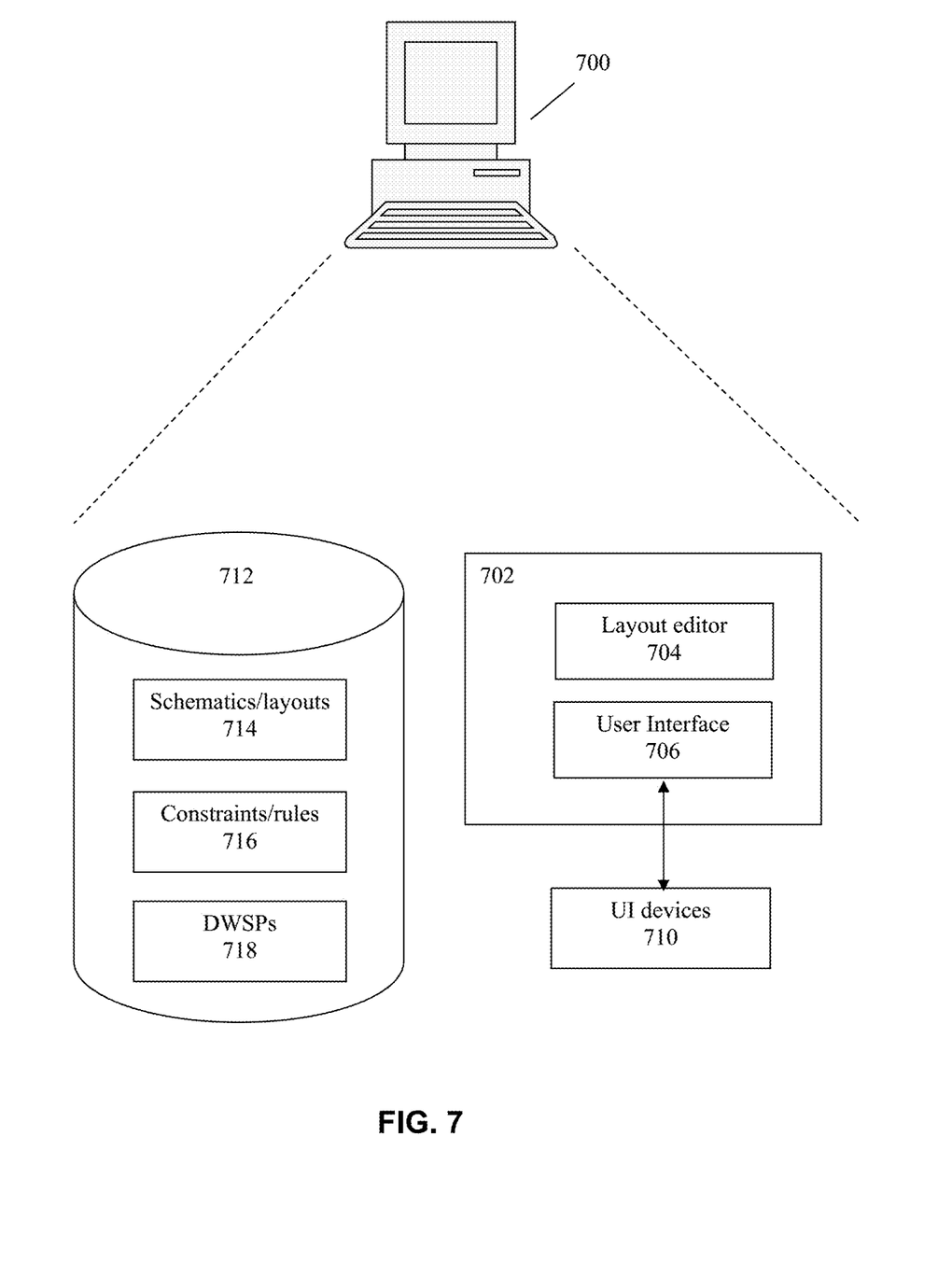
FIG. 7 is a functional block diagram illustrating an example system for dynamic WSPs for handling complex design rules in an integrated circuit design according to the present embodiments.

FIG. 7 is a functional block diagram of an example system for dynamic WSPs according to the present embodiments.

In embodiments, the system 700 can be one or more general purpose computers that are loaded with software (e.g., EDA tools) and/or customized to include hardware for interactively implementing physical electronic designs. In some embodiments, the one or more computing systems 700 comprise various components not shown such as processor(s) or processor core(s), memory, disks, etc. The software and/or custom hardware may include interactive or automated modules such as a placer, a routing engine, a layout editor, a design rule checker, a verification engine, or a floorplanner, etc. as will be appreciated by those skilled in the art. In some embodiments, the one or more computing systems are implemented in a "cloud" configuration and/or a client/server configuration. For example, one or more server computers may be loaded with application software (e.g., a layout editor tool) for implementing some or all of the methodology of the present embodiments, and one or more client computers can communicate with the server computer(s) via a network to perform some or all of the methodology of the embodiments for a particular design.

The one or more computing systems 700 may further write to and read from a local or remote volatile or non-volatile computer accessible storage 712 that stores thereon data or information such as, but not limited to, one or more databases such as schematic design database(s) or physical design database(s), layouts, etc. 714, and libraries, data, rule decks, constraints (e.g., track specifications, minimum spacing, widths, BC rules, BCB rules, process rules, design rules (such as parallel run length rules, line end-to-end spacing rules, etc.)), etc. 716. As further shown, storage 712 includes dynamic WSPs 718, which initially include width-spacing patterns that have been generated for a particular process or design, and thereafter dynamically updated in accordance with the methodology of the present embodiments (e.g. by layout editor 704 as described below).

In some embodiments, the one or more computing systems 700 may, by various standalone software, hardware modules or combinations thereof implement an EDA tool 702 that includes a layout editor 704 and a user interface module 706. EDA tool 702 may include interactive or automated modules for interactively implementing designs for integrated circuits that are not shown such as place-and-route tools, floorplanners, design rule checkers, verification engines, signal and power integrity checkers, etc. as will be appreciated by those skilled in the art. In other embodiments, EDA tool 702 is a standalone application that only includes layout editor functionality and/or is adapted to communicate with other automated EDA modules such as those described above.

In operation, a user can interact with layout editor tool 704 via user interface module 706 to operate on layouts in accordance with dynamic WSPs as described above. More particularly, when layout editor 704 is being used to create or modify a portion of an integrated circuit design stored in layouts 712, using the methodology described above. For example, in response to user actions (e.g. creating a new wire) conducted using interface devices 710 (e.g., mouse, trackball, touchpad, touchscreen, etc.) and user interface 706 (e.g. menus, controls, list boxes, dialogue boxes, etc.), layout editor 704 accesses constraints 716 and dynamic WSPs 716 in database 712 and creates visual indications of dynamic WSPs and displays them to the user via user interface devices 710 (e.g., display monitor) and user interface 706. In these and other examples, after a user has competed an edit (e.g. creating a new wire), layout editor 704 can update the dynamic WSPs 716 in database 712. Layout editor 704 can further include conventional functionality for receiving and updating integrated circuit design and/or layout information for the current design in layouts 712 in response to the user actions.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method for physically implementing a design for an integrated circuit, comprising:
   identifying a width-space pattern (WSP) for the design, the WSP having width and spacing requirements;
   identifying a design rule for the design;
   receiving a request from a user for editing a shape in the design;
   determining a constraint imposed by the design rule on the WSP for any subsequent edits of the design based on the requested edit the constraint being separate from and in addition to the width and spacing requirements of the WSP; and
   providing a visual indication of the constraint imposed by the design rule to the user while the user is making a subsequent edit to the design, the visual indication providing information about limits on the subsequent edit that can be made while adhering to the constraint.

2. The method of claim 1, further comprising:
   receiving a confirmation of the requested edit; and
   updating the WSP based on the received confirmation, wherein updating includes adding information about the constraint to the WSP.

3. The method of claim 1, further comprising providing an alert to the user when a subsequent requested edit to the design violates the constraint.

4. The method of claim 1, further comprising generating a display of a plurality of tracks in the WSP, wherein providing the visual indication includes adjusting the display of the plurality of tracks.

5. The method of claim 4, wherein adjusting the display includes changing a color of one or more of the plurality of tracks in accordance with the determined constraint.

6. The method of claim 1, wherein the design rule is a parallel run length rule.

7. The method of claim 1, wherein the design rule is a line end-to-end spacing rule.

8. The method of claim 1, wherein the design rule is an end-of-line keepout rule.

9. The method of claim 1, wherein the design rule is a line maximum length rule.

10. A system for physically implementing a design for an integrated circuit, comprising:
   a storage for a width-space pattern (WSP) for the design, the WSP having width and spacing requirements;
   a user interface;
   an EDA tool that is configured to:
      identify a design rule for the design;
      receive a request from a user for editing a shape in the design via the user interface;
      determine a constraint imposed by the design rule on the WSP for any subsequent edits of the design based on the requested edit the constraint being separate from and in addition to the width and spacing requirements of the WSP; and
      provide a visual indication of the constraint imposed by the design rule to the user via the user interface while the user is making a subsequent edit to the design, the visual indication providing information about limits on the subsequent edit that can be made while adhering to the constraint.

11. The system of claim 10, wherein the EDA tool is further configured to:
   receive a confirmation of the requested edit via the user interface; and
   updating the WSP in the storage based on the received confirmation, wherein updating includes adding information about the constraint to the WSP.

12. The system of claim 10, wherein the EDA tool is further configured to provide an alert to the user via the user interface when a subsequent requested edit to the design violates the constraint.

13. The system of claim 10, wherein the EDA tool is further configured to generate a display of a plurality of tracks in the WSP in the user interface, wherein providing the visual indication includes adjusting the display of the plurality of tracks via the user interface.

14. The system of claim 13, wherein adjusting the display includes changing a color of one or more of the plurality of tracks in accordance with the determined constraint.

15. The system of claim 10, wherein the design rule is a parallel run length rule.

16. The system of claim 10, wherein the design rule is a line end-to-end spacing rule.

17. The system of claim 10, wherein the design rule is an end-of-line keepout rule.

18. The system of claim 10, wherein the design rule is a line maximum length rule.

19. The system of claim 10, wherein the EDA tool is a layout editor.

20. A non-transitory computer readable medium having instructions stored thereon which, when executed by a processor, cause the processor to perform a method for physically implementing a design for an integrated circuit, the method comprising:
   identifying a width-space pattern (WSP) for the design, the WSP having width and spacing requirements;
   identifying a design rule for the design;
   receiving a request from a user for editing a shape in the design;
   determining a constraint imposed by the design rule on the WSP for any subsequent edits of the design based on the requested edit the constraint being separate from and in addition to the width and spacing requirements of the WSP; and
   providing a visual indication of the constraint imposed by the design rule to the user while the user is making a subsequent edit to the design, the visual indication providing information about limits on the subsequent edit that can be made while adhering to the constraint.

* * * * *